(12) United States Patent
Takeyama et al.

(10) Patent No.: US 8,473,760 B2
(45) Date of Patent: Jun. 25, 2013

(54) MEMORY SYSTEM AND SERVER SYSTEM

(75) Inventors: Yoshikazu Takeyama, Fujisawa (JP);
Keizo Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 285 days.

(21) Appl. No.: 13/049,376

(22) Filed: Mar. 16, 2011

(65) Prior Publication Data

US 2011/0231687 A1      Sep. 22, 2011

(30) Foreign Application Priority Data

Mar. 16, 2010   (JP) .................................. 2010-059858

(51) Int. Cl.
*G06F 12/16*      (2006.01)
*G06F 12/00*      (2006.01)

(52) U.S. Cl.
USPC ................... 713/300; 713/1; 713/2; 713/310; 713/320; 713/321; 713/322; 713/323; 713/324; 713/330; 713/340

(58) Field of Classification Search
USPC ................. 713/1, 2, 300, 310, 320–324, 330, 713/340
See application file for complete search history.

(56) References Cited

U.S. PATENT DOCUMENTS

| | | | | |
|---|---|---|---|---|
| 7,266,664 | B2 * | 9/2007 | Higuchi et al. | 711/173 |
| 7,613,877 | B2 * | 11/2009 | Shimozono et al. | 711/113 |
| 2002/0120820 | A1 * | 8/2002 | Higuchi et al. | 711/154 |
| 2008/0104344 | A1 * | 5/2008 | Shimozono et al. | 711/162 |
| 2010/0202198 | A1 * | 8/2010 | Kim et al. | 365/185.03 |
| 2010/0281204 | A1 * | 11/2010 | Yano et al. | 711/103 |

FOREIGN PATENT DOCUMENTS

| | | |
|---|---|---|
| JP | 2004-348641 A | 12/2004 |
| JP | 2008-108026 | 5/2008 |
| JP | 2009-211223 A | 9/2009 |
| JP | 2009-211224 A | 9/2009 |

OTHER PUBLICATIONS

Japanese Office Action issued Apr. 10, 2012 in patent application No. 2010-059858 with English translation.

* cited by examiner

*Primary Examiner* — M Elamin
(74) *Attorney, Agent, or Firm* — Oblon, Spivak, McClelland, Maier & Neustadt, L.L.P.

(57) ABSTRACT

According to one embodiment, a memory system includes a NAND flash memory includes a memory cell array includes pages, and a volatile data register with a storage capacity of one page, and configured to write page data to the memory cell array through the data register, each of the pages includes nonvolatile memory cells and being a unit of data write, a volatile RAM, and a controller includes a power saving mode in which power consumption of the RAM is reduced, and configured to transfer data of the RAM to the data register before entering the power saving mode.

20 Claims, 8 Drawing Sheets

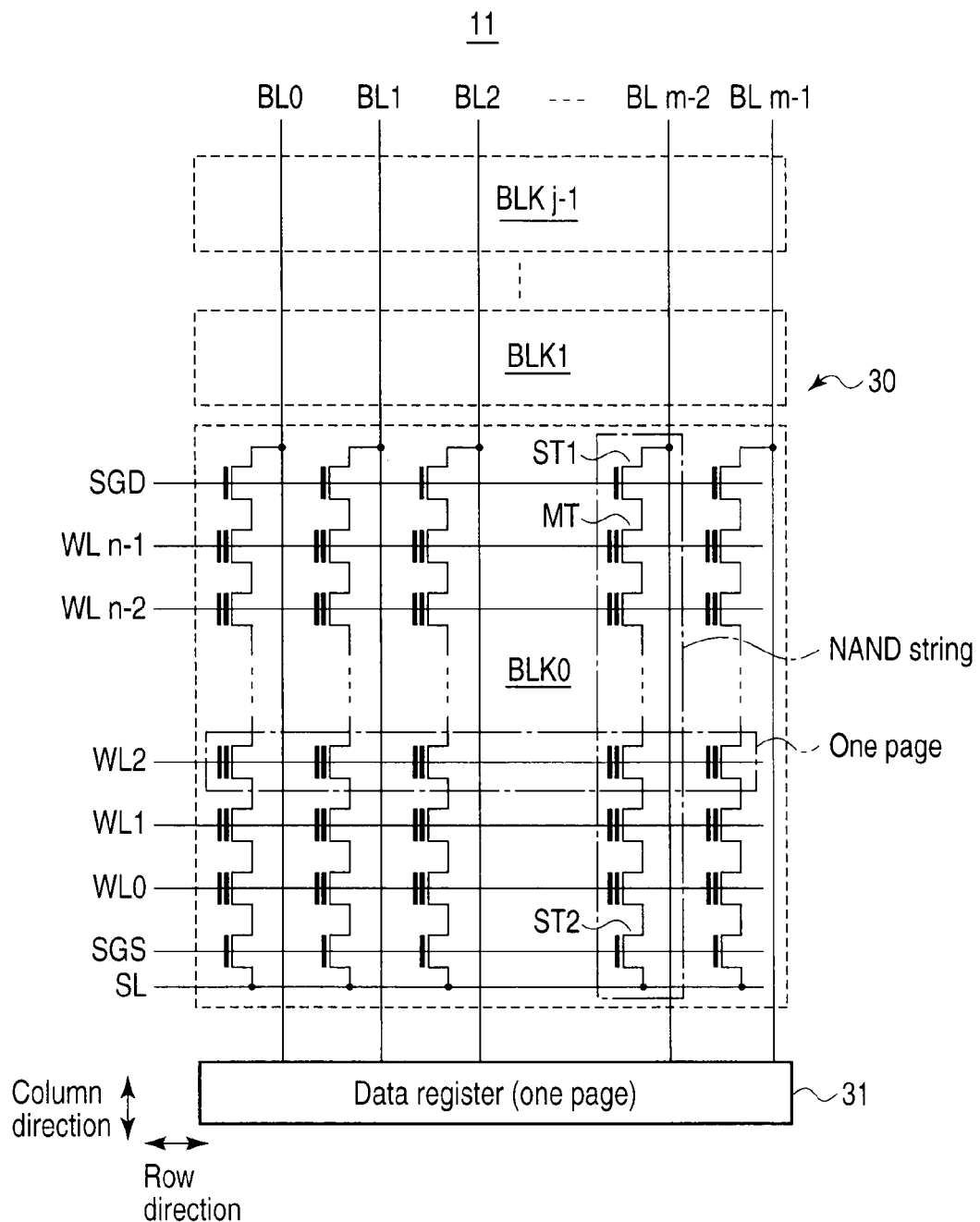
F I G. 4

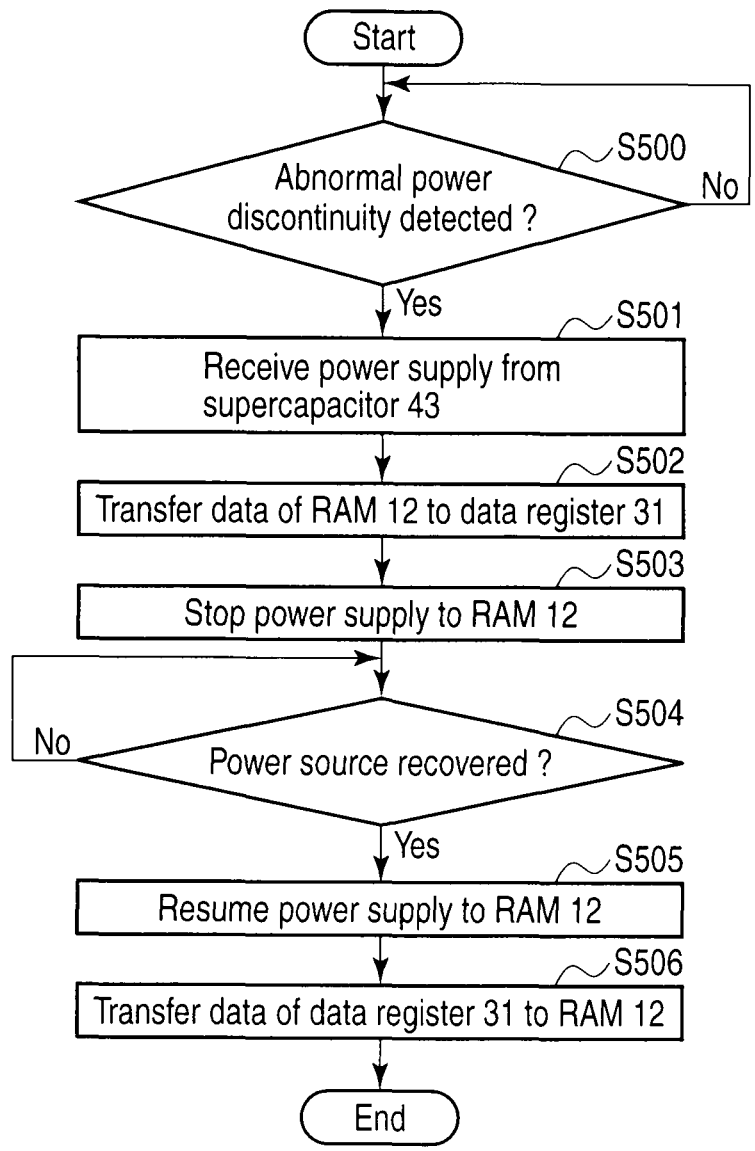
F I G. 12

MEMORY SYSTEM AND SERVER SYSTEM

CROSS-REFERENCE TO RELATED APPLICATIONS

This application is based upon and claims the benefit of priority from Japanese Patent Application No. 2010-059858, filed Mar. 16, 2010; the entire contents of which are incorporated herein by reference.

FIELD

Embodiments described herein relate generally to a memory system and server system.

BACKGROUND

As one of electrically erasable programmable read-only memories (EEPROMs), a NAND flash memory is known. NAND flash memories are used as various recording media including a file memory and memory card.

A memory system including the NAND flash memory is configured to further include, for example, a controller, and random access memory (RAM) used for storing temporary data. In the NAND flash memory, although various data items necessary for the controller to operate are stored, reading data from the NAND flash memory each time the data is used takes much time. Accordingly, for example, data once read from the NAND flash memory is stored in a RAM, and the controller uses the data stored in the RAM to operate the system.

Power consumption of the RAM is large, and hence it is conceivable that the power supply for the RAM is turned off for the purpose of reducing the consumption current when there is no access to the RAM. However, when the power supply of the RAM is turned off, data items stored in the RAM are erased, and hence when the power supply of the RAM is turned on, the need to reload necessary data from the NAND flash memory arises. In order to load data from the NAND flash memory, although it is necessary to access the NAND flash memory to carry out page read, page read of the NAND flash memory takes much time, and the consumption current thereof is not small.

It should be noted that in Jpn. Pat. Appln. KOKAI Publication No. 2008-108026, a technique for reducing the capacity of a battery necessary for the backup for a cache memory in a storage system provided with a volatile cache memory is disclosed.

BRIEF DESCRIPTION OF THE DRAWINGS

FIG. 4 is a circuit diagram showing the configuration of a NAND flash memory 11.

FIG. 12 is a flowchart showing operations of a controller 41.

DETAILED DESCRIPTION

Figure 1:
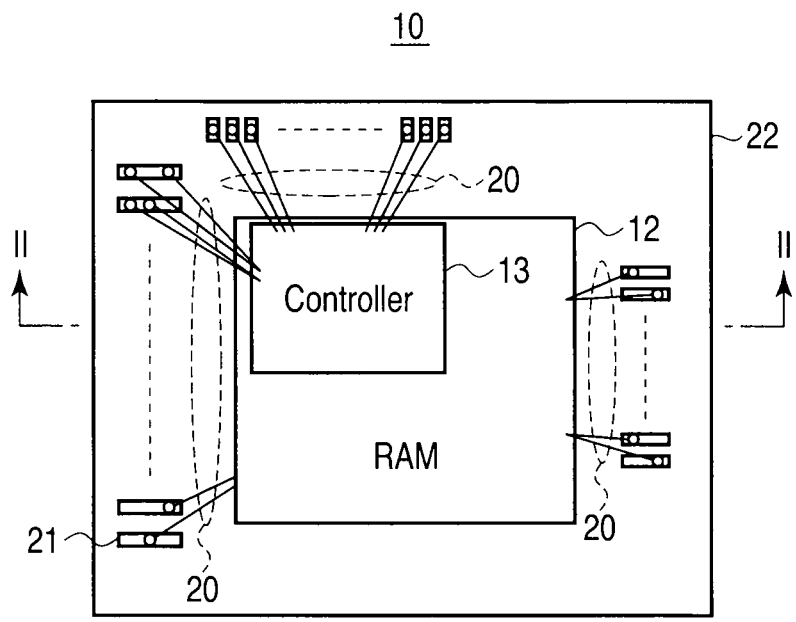
FIG. 1 is a view showing the layout of a memory system 10 according to a first embodiment.

In general, according to one embodiment, there is provided a memory system comprising:

a NAND flash memory comprising a memory cell array comprising pages, and a volatile data register with a storage capacity of one page, and configured to write page data to the memory cell array through the data register, each of the pages comprising nonvolatile memory cells and being a unit of data write;

a volatile RAM; and a controller comprising a power saving mode in which power consumption of the RAM is reduced, and configured to transfer data of the RAM to the data register before entering the power saving mode.

The embodiments will be described hereinafter with reference to the accompanying drawings. In the description which follows, the same or functionally equivalent elements are denoted by the same reference numerals, to thereby simplify the description.

First Embodiment

A memory system 10 of this embodiment comprises one or a plurality of NAND flash memories 11, RAM 12, and controller 13 configured to control operations of the NAND flash memory 11 and RAM 12.

The memory system 10 may be configured in such a manner that a plurality of modules constituting the memory system 10 are mounted on a motherboard on which a host is mounted or may be configured as a system large-scale integrated circuit (LSI) or a system-on-chip (SoC) configured to realize the memory system 10 by one chip. In this embodiment, the memory system 10 will be described below by taking a multichip package (MCP) in which a plurality of modules (chips) are mounted on one substrate as an example of means for realizing the memory system 10. The MCP is used as, for example, a memory used by the host to store data.

Figure 2:
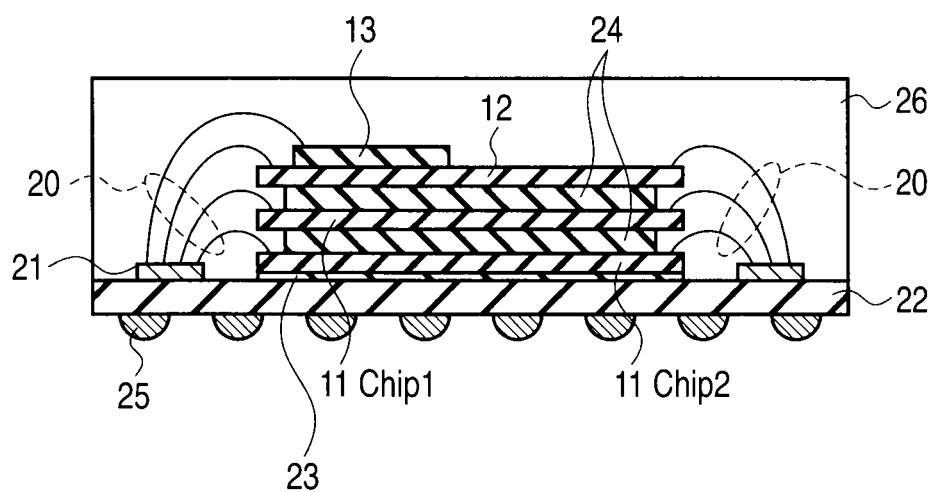
FIG. 2 is a cross-sectional view of the memory system 10 taken along line II-II shown in FIG. 1.

FIG. 1 is a view showing the layout of the memory system 10 (MCP) according to the first embodiment. FIG. 2 is a cross-sectional view of the memory system 10 taken along line II-II shown in FIG. 1. The memory system 10 comprises, for example, two NAND flash memory chips.

On a substrate 22, a NAND flash memory (chip 2) 11, spacer 24, NAND flash memory (chip 1) 11, spacer 24, RAM 12, and controller 13 are stacked one on top of the other in sequence. The NAND flash memory (chip 2) 11 of the lowermost layer is fixed to the substrate 22 by means of an underfill 23 constituted of a resin.

A plurality of terminals 21 are provided on the substrate 22. Terminals of each chip are electrically connected to the terminals 21 on the substrate 22 through bonding wires 20. Data transfer between a plurality of chips is carried out by using bonding wires 20 or wiring directly connecting between chips adjacent to each other in the vertical direction.

Solder balls 25 are provided on the underside of the substrate 22. The solder balls 25 are electrically connected to the terminals 21. The memory system 10 is solder-mounted on, for example, a printed board on which a host is mounted, and carries out data transfer between itself and the host. The plurality of chips stacked on the substrate 22, and bonding wires 20 are sealed with a molded resin 26.

Figure 3:
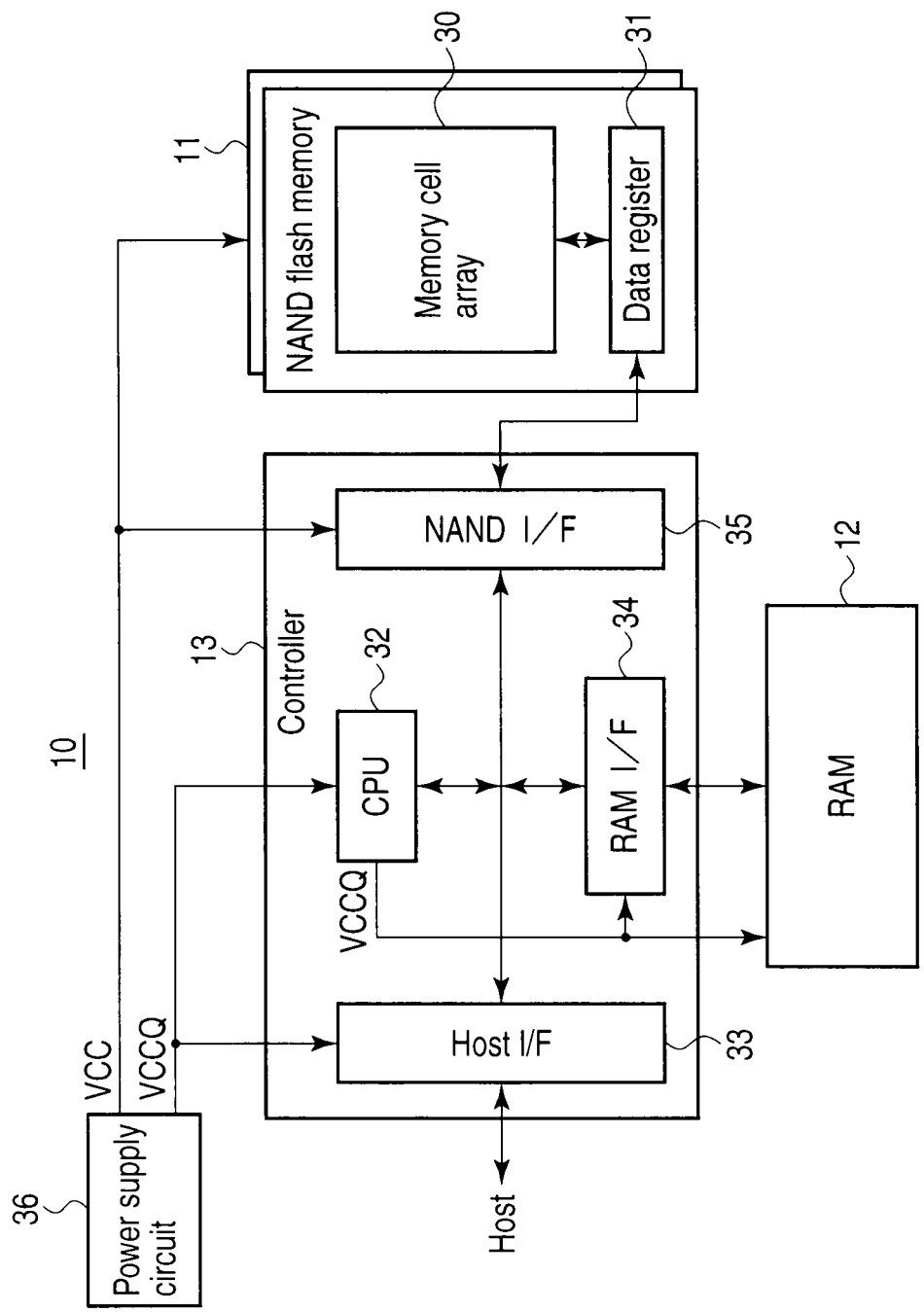
FIG. 3 is a block diagram showing the configuration of the memory system 10.

FIG. 3 is a block diagram showing the configuration of the memory system 10. The RAM 12 is a volatile memory, and when the power supply is turned off, information stored before that time is lost. As the RAM 12, for example, a DRAM is used.

In order to enhance the reading speed of the controller 13, the RAM 12 bears a role of a read cache configured to temporarily store therein a program or other data items stored in the NAND flash memory 11. This is because the NAND flash memory 11 requires sequential access, and hence data stored in the NAND flash memory 11 is once read into the RAM 12 to enable random access. Further, page read of the NAND flash memory 11 takes much time, hence data stored in the NAND flash memory 11 is once read into the RAM 12, and thereafter the RAM 12 is accessed, whereby it is possible to enhance the reading speed of the controller 13. Furthermore, the RAM bears a role of a write cache configured to temporarily store therein data to be written to the NAND flash memory 11.

The NAND flash memory 11 is a nonvolatile semiconductor memory. The NAND flash memory 11 comprises a memory cell array 30 and data register 31. The memory cell array 30 comprises a plurality of blocks BLK. Each block BLK is a minimum unit of data erasure. Each block BLK comprises a plurality of pages. Each page is a minimum unit of data read or data write. It should be noted that although illustration is omitted, the NAND flash memory 11 comprises circuits necessary to carry out data read, write, and erase with respect to the memory cell array 30, such as a decoder configured to decode an address, word-line driver configured to control a voltage of a word line, sense amplifier configured to detect data from a bit line, and the like. The number of the NAND flash memories is not particularly limited, and may be one or two or more. In the following description, although one NAND flash memory 11 will be mentioned, when a plurality of NAND flash memories are used, the following explanation is applied to each NAND flash memory 11.

FIG. 4 is a circuit diagram showing the configuration of a NAND flash memory 11. The memory cell array 30 comprises j blocks BLK0 to BLKj−1 (j is a positive integer). Each block BLK comprises m NAND strings arranged in sequence in the row direction (m is a positive integer). In select transistors ST1 included in NAND strings, drains of those are commonly connected to bit lines BL, and gates of those are commonly connected to a select gate line SGD. In select transistors ST2 included in the NAND strings, sources of those are commonly connected to source line SL, and gates of those are commonly connected to a select gate line SGS.

Each memory cell transistor MT is constituted of a metal oxide semiconductor field-effect transistor (MOSFET) having a stacked gate structure formed on a p-type well. The stacked gate structure includes a charge-storage layer (floating-gate electrode) formed on the p-type well with interposition of a gate insulating film, and control gate electrode formed on the floating-gate electrode with interposition of an inter-gate insulating film. In the memory cell transistor MT, a threshold voltage changes in accordance with the number of electrons stored in the floating-gate electrode, and data is stored in accordance with the difference in the threshold voltage. The memory cell transistor MT may be configured to store binary data (one-bit data) or may be configured to store multilevel data (data of two or more bits).

The memory cell transistor MT is not limited to the floating-gate structure having a floating-gate electrode, and may have a structure of a metal-oxide-nitride-oxide-silicon (MONOS) type or the like in which a threshold voltage can be adjusted by causing a nitride film interface serving as a charge-storage layer to trap electrons. The memory cell transistor MT of the MONOS structure may likewise be configured to store binary data (one-bit data) or may be configured to store multilevel data (data of two or more bits).

In each NAND string, n (n is a positive integer) memory cell transistors MT are arranged in such a manner that current paths of the memory cell transistors MT are connected in series between a source of select transistor ST1, and drain of select transistor ST2. That is, the n memory cell transistors MT are connected in series in the column direction in such a form that memory cell transistors adjacent to each other share a diffusion region (source region or drain region) with each other.

In each NAND string, control gate electrodes of the memory cell transistors MT are connected to word lines WL0 to WLn−1 in sequence from a memory cell transistor MT positioned closest to the source side. Accordingly, a drain of a memory cell transistor MT a gate of which is connected to the word line WLn−1 is connected to the source of select transistor ST1, and a source of a memory cell transistor MT a gate of which is connected to the word line WL0 is connected to the drain of select transistor ST2.

The word lines WL0 to WLn−1 commonly connect the control gate electrodes of the memory cell transistors MT between the NAND strings in the block BLK. That is, control gate electrodes of memory cell transistors MT on the same row in the block are connected to the same word line WL. The m memory cell transistors MT connected to the same word line WL are treated as one page, and read or write of data is carried out for each page.

Further, the bit lines BL0 to BLm−1 commonly connect the drains of select transistors ST1 in each block BLK. That is, NAND strings on the same column in the blocks BLK0 to BLKj−1 are connected to the same bit line BL.

The bit lines BL0 to BLm−1 are connected to the data register 31 through sense amplifiers (not shown). As described previously, in the NAND flash memory 11, read or write of data is carried out in units of pages, and hence, for example, when one memory cell transistor MT stores binary data (one-bit data), a data register 31 configured to temporarily store data of at least one page becomes necessary. In this embodiment, the storage capacity of the data register 31 corresponds to data of one page, and hence one memory cell transistor MT stores binary data. It should be noted that a configuration example of multilevel data will be described later.

The data register 31 is a volatile memory, and is constituted of flip-flops and the like. The data register 31 temporarily stores therein read data of one page. The read data of one page stored in the data register 31 is sent to the controller 13. Further, the data register 31 temporarily stores therein write data of one page sent from the controller 13. The write data of one page stored in the data register 31 is written to the memory cell array 30.

The controller 13 carries out data transfer between itself and the host in accordance with an instruction from the host. In order to execute the data transfer, the controller 13 controls the RAM 12 and NAND flash memory 11. That is, the controller 13 writes data transferred from the host to the NAND flash memory 11 or the RAM 12 in response to a command from the host. Further, the controller 13 transfers data read from the NAND flash memory 11 or the RAM 12 to the host in response to a command from the host.

The controller 13 comprises a central processing unit (CPU) 32, host interface circuit (host I/F) 33, RAM interface circuit (RAM I/F) 34, and NAND interface circuit (NAND I/F) 35. The CPU 32, host interface circuit 33, RAM interface circuit 34, and NAND interface circuit 35 are connected to each other through a bus.

The host interface circuit 33 carries out control of operation timing, conversion of a signal format (interface processing) and the like in accordance with a predetermined protocol. The RAM interface circuit 34 carries out interface processing between itself and the RAM 12 in accordance with a predetermined protocol. The NAND interface circuit 35 carries out interface processing between itself and the NAND flash memory 11 in accordance with a predetermined protocol.

The memory system 10 receives voltages of a plurality of types necessary for the operation from a power supply circuit 36. The power supply circuit 36 generates operating voltages VCC and VCCQ (e.g., VCC>VCCQ). The operating voltage VCC is applied to the NAND interface circuit 35, and NAND flash memory 11. The operating voltage VCCQ is applied to the CPU 32, and host interface circuit 33. The RAM 12 and RAM interface circuit receive the operating voltage VCCQ from the CPU 32. The place at which the power supply circuit 36 is arranged is not particularly limited, and the circuit 36 may be arranged within the host, or may be arranged outside the host.

(Operation)

Next, operations of the memory system 10 configured in this manner will be described below. Among RAMs, for example, a dynamic random access memory (DRAM) requires, in order to retain data stored in itself, a refresh operation at intervals of a predetermined time, and a current consumed by the refresh operation is large. Thus, in this embodiment, the memory system 10 has a power saving mode in which the power consumption of the RAM 12 is reduced, for example, when there is no instruction from the host for a predetermined time (in idle state).

The power saving mode implies a state where the RAM 12 is made unable to retain data. The power saving mode includes a mode in which a clock generator inside the RAM 12 is stopped, and the refresh operation is not carried out, thereby suppressing the power consumption, i.e., a so-called deep power-down mode. Further, the power saving mode includes an operation of turning off the power supply of the RAM 12 (i.e., stopping application of the operating voltage VCCQ). The deep power-down mode has an advantage that the recovery time is shorter than the case where the power supply of the RAM 12 is turned off. Hereinafter, the power saving mode will be described by taking the above-mentioned deep power-down mode as an example.

Figure 5:
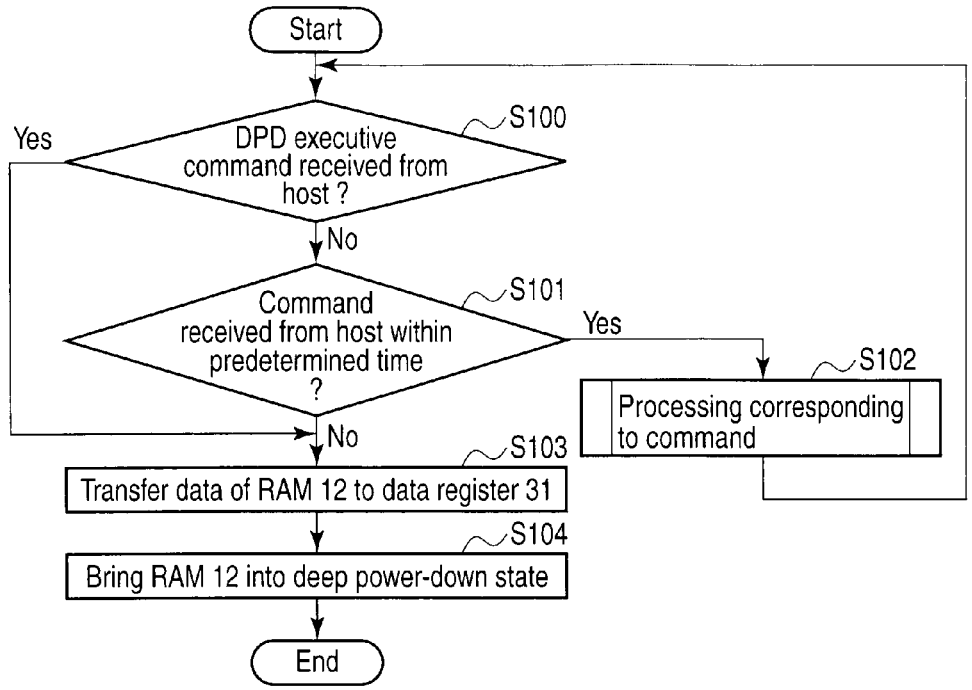
FIG. 5 is a flowchart showing operations of a controller 13 in a deep power-down mode.

FIG. 5 is a flowchart showing operations of the controller 13 in the deep power-down mode. It should be noted that it is assumed in the first embodiment that the storage capacity of the RAM 12 is less than or equal to the storage capacity of the data register 31.

The controller 13 monitors whether or not a deep power-down executive command (DPD executive command) to execute a deep power-down mode has been received from the host (step S100). When the deep power-down executive command has been received from the host, the controller 13 shifts to step S103 to immediately execute the deep power-down mode.

When the deep power-down executive command has not been received from the host, the controller 13 monitors whether or not any one of a plurality of specified commands has been received from the host within a predetermined time (step S101). When an arbitrary command has been received from the host, the controller 13 executes processing corresponding to the command (step S102).

On the other hand, when none of the commands has been received from the host within the predetermined time, the controller 13 shifts to step S103 to execute the deep power-down mode. First, the controller 13 transfers data of the RAM 12 to the data register 31 (step S103). More specifically, the controller 13 sends a read command, and address to the RAM 12 to read all the data items stored in the RAM 12. Subsequently, the controller 13 sends a register write command, address, data, and executive command to the NAND flash memory 11. In response to this, the NAND flash memory 11 transfers the data sent from the controller 13 to the data register 31.

It should be noted that, for example, after sending a serial data input command, address, and data to the NAND flash memory 11, it is possible for the controller 13 to realize data transfer only to the data register 31 by sending not an executive command to write data to the memory cell array 30, but a reset command to the NAND flash memory 11. Alternatively, data transfer to only the data register 31 may be carried out, and a command sequence exclusively used to continue to retain the data stored in the data register 31 may be set without executing data write to the memory cell array 30.

Subsequently, the controller 13 brings the RAM 12 into the deep power-down state (step S104). More specifically, the controller 13 issues a command to the RAM 12, the RAM 12 stops its own clock generator, and stops the refresh operation in response to this command. At this time, data stored in the RAM 12 is lost. Alternatively, the controller 13 may turn off the power supply of the RAM 12, i.e., the controller 13 may stop the application of the operating voltage VCCQ to the RAM 12 in place of executing the deep power-down mode.

Figure 6:
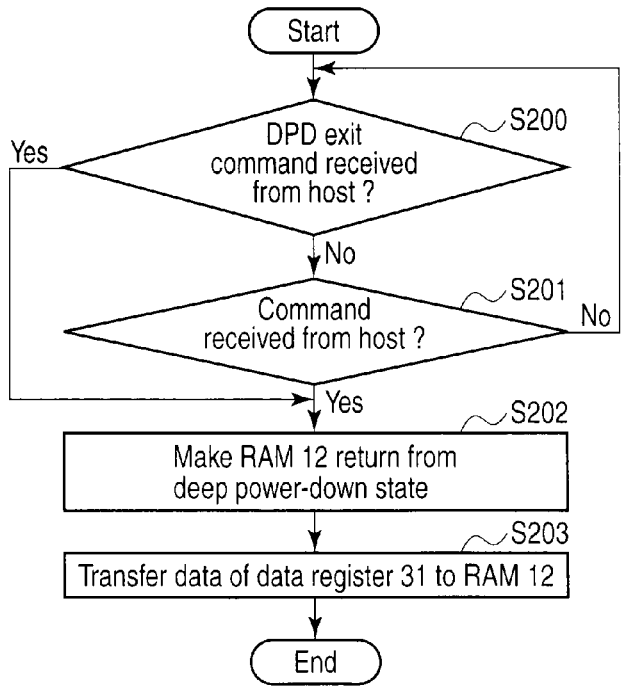
FIG. 6 is a flowchart showing operations of the controller 13 at the time of exiting the deep power-down mode.

FIG. 6 is a flowchart showing operations of the controller 13 at the time of exiting the deep power-down mode. The controller 13 monitors whether or not a deep power-down exit command (DPD exit command) to exit the deep power-down mode has been received from the host (step S200). When the deep power-down exit command has been received from the host, the controller 13 shifts to step S202 to immediately execute deep power-down mode exit processing.

When the deep power-down exit command has not been received from the host, the controller 13 monitors whether or not any one of a plurality of specified commands has been received from the host (step S201). When no arbitrary command has been received from the host, the controller 13 continues to keep the power supply of the RAM 12 off.

On the other hand, when an arbitrary command has been received from the host, the controller 13 shifts to step S202 to execute the deep power-down mode exit processing. First, the controller 13 makes the RAM 12 return from the deep power-down state (step S202). More specifically, the controller 13 issues a command to the RAM 12, the RAM 12 starts its own clock generator, and begins the refresh operation in response to this command. Alternatively, when the power supply of the RAM 12 is off, the controller 13 turns on the power supply of the RAM 12, i.e., the controller 13 starts the application of the operating voltage VCCQ to the RAM 12.

Subsequently, the controller 13 transfers data of the data register 31 to the RAM 12 (step S203). More specifically, the controller 13 sends a register read command, address, and executive command to the NAND flash memory 11. In response to this, the NAND flash memory 11 sends data of the data register 31 to the controller 13. Subsequently, the controller 13 sends a write command, address, and data to the RAM 12, and writes the data sent from the NAND flash memory 11 to the RAM 12.

At this point, the same data as that before the deep power-down mode is stored in the RAM 12. Accordingly, it is possible for the controller 13 to resume and continuously carry out data transfer processing by using data of the RAM 12 without loading data into the RAM 12 again.

(Advantage)

As described above in detail, in the first embodiment, the memory system 10 has a power saving mode (e.g., deep power-down mode) in which the power consumption of the RAM 12 is reduced when there is no access thereto from the host. At the time of the deep power-down mode, the controller 13 transfers data of the RAM 12 to the data register 31 in the NAND flash memory 11, and thereafter brings the RAM 12 into the deep power-down state. Subsequently, when access occurs from the host, the controller 13 makes the RAM 12 return from the deep power-down state, and transfers data of the data register 31 to the RAM 12.

Therefore, according to the first embodiment, it is possible to reduce the power consumption of the RAM 12 in the period in which there is no access from the host and, by extension it is possible to reduce the power consumption of the memory system 10. Further, when the deep power-down mode is exited, there is no need to read data from the memory cell array 30 of the NAND flash memory 11, and hence it is possible to reduce the data read time.

Further, when the deep power-down mode is exited, data loaded into the RAM 12 before the deep power-down mode is kept stored therein, and hence the controller 13 can resume and continue the data transfer processing from the state before the deep power-down mode. Hereby, the operation performance of the memory system 10 is improved.

For example, when the data of the RAM 12 is transferred to the memory cell array 30 of the NAND flash memory 11, a general page write operation (including a verification operation) is required. Further, when the data of the memory cell array 30 is transferred to the RAM 12, a general page read operation is required. The page write operation and page read operation take much time, and hence the data transfer time from the RAM 12 to the NAND flash memory 11, and data transfer time from the NAND flash memory 11 to the RAM 12 become long. Conversely, in the first embodiment, the data register 31 is constituted of a volatile memory such as a flip-flop or the like, and hence it is possible to carry out the data write operation of writing data to the data register 31, and data read operation of reading data from the data register 31 at high speed. Accordingly, it is possible to shorten the time needed to transfer data of the RAM 12 to the data register 31, and time needed to transfer data of the data register 31 to the RAM 12 and, by extension it is possible to shorten the transition time to the deep power-down mode, and recovery time from the deep power-down mode.

Second Embodiment

When the storage capacity of the RAM 12 is less than or equal to the storage capacity of the data register 31, it is possible, as described in the first embodiment, to transfer all the data items of the RAM 12 to the data register 31 at the time of the deep power-down mode. However, when the storage capacity of the RAM 12 is greater than the storage capacity of the data register 31, it is not possible to store all the data items of the RAM 12 in the data register 31. Thus, in the second embodiment, when the storage capacity of the RAM 12 is greater than the storage capacity of the data register 31, only specific data is selected from among the data items stored in the RAM 12, and is stored in the data register 31.

Figure 7:
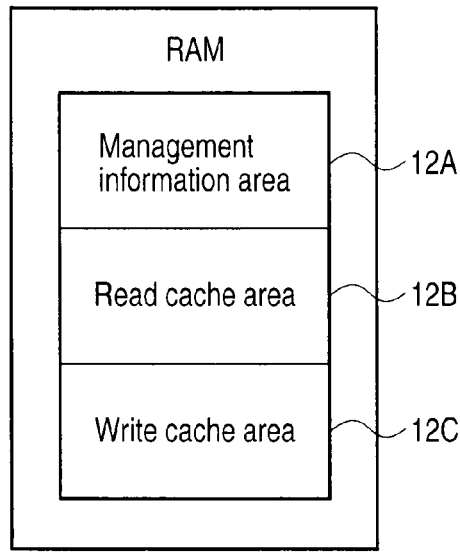
FIG. 7 is a schematic view for explaining storage areas of a RAM 12 according to a second embodiment.

The configuration of the memory system 10 is identical with FIG. 3 described in the first embodiment. FIG. 7 is a schematic view for explaining storage areas of a RAM 12 according to a second embodiment. The RAM 12 comprises a management information area 12A, read cache area 12B, and write cache area 12C. The storage capacity of the RAM 12 is greater than the storage capacity of the data register 31. Further, the storage capacity of the data register 31 is greater than the storage capacity of the management information area 12A.

In the management information area 12A, management information used by the CPU 32 to manage the state of the NAND flash memory 11 and/or the RAM 12 is stored. In the management information, a logical address/physical address conversion table and the like necessary for determining an address of data stored in the NAND flash memory is included. The NAND flash memory has the characteristics which require data copy processing between blocks when the data is rewritten, and hence a logical block address managed on the host side, and actual physical block address on the NAND flash memory side do not coincide with each other. Accordingly, after the logical block address is converted into the physical block address by using the logical address/physical address conversion table, the block to be actually accessed is specified on the basis of the physical block address. Further, in the management information, a table and the like used to manage information indicating whether a block is in the erased state or the block is unusable are included.

The read cache area 12B is used as a read cache for the CPU 32. In the read cache area 12B, data identical with the data stored in the NAND flash memory 11 is stored. When specific data stored in the NAND flash memory 11 is frequently read, if the NAND flash memory 11 is accessed each time, the read time becomes long, and the processing speed of the CPU 32 is deteriorated. Accordingly, the specific data to be frequently read is transferred from the NAND flash memory 11 to be previously stored in the RAM 12, and the CPU 32 reads the specific data from the RAM 12 the reading speed of which is higher than the NAND flash memory 11.

The write cache area 12C is used as a write cache to be used by the CPU 32 to carry out write-through processing and write-back processing. At the time of write-through processing, the CPU 32 simultaneously writes the same data to the NAND flash memory 11 and write cache area 12C. At the time of write-back processing, the CPU 32 temporarily writes data to the write cache area 12C and, at a vacant time in the processing, writes the data of the write cache area 12C to the NAND flash memory 11.

(Operation)

Figure 8:
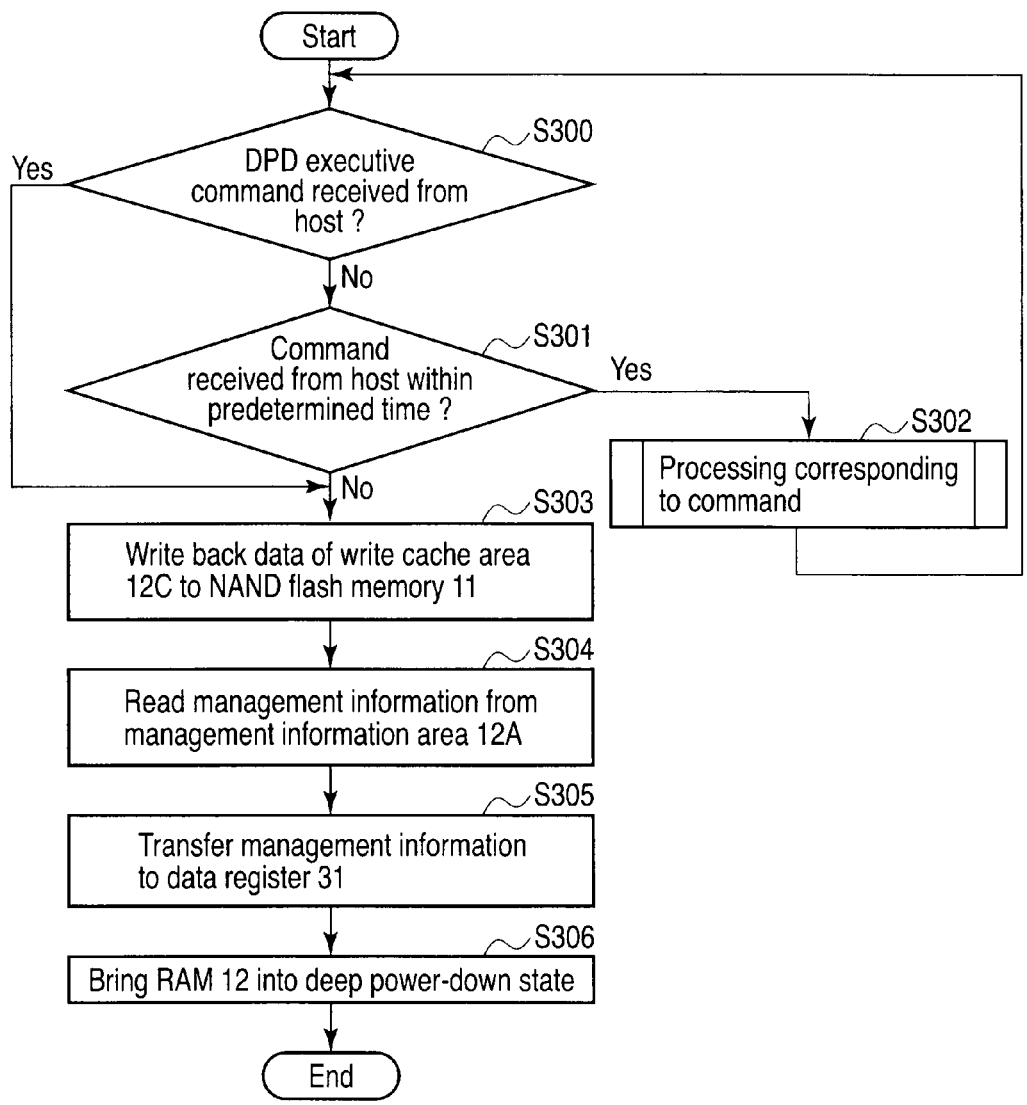
FIG. 8 is a flowchart showing operations of a controller 13 in a deep power-down mode.

Next, operations of the memory system 10 configured as described above will be described below. FIG. 8 is a flowchart showing operations of a controller 13 in the deep power-down mode. Operations in steps S300 to S302 of FIG. 8 are identical with those in steps S100 to S102 of FIG. 5.

When a deep power-down executive command is received from the host, or when any one of commands has not been received within a predetermined time, the controller 13 shifts to step S303 to execute the deep power-down mode. First, the controller 13 writes back (puts back) data stored in the write cache area 12C to the NAND flash memory 11 (step S303).

Subsequently, the controller 13 reads management information from the management information area 12A of the RAM 12 (step S304). That is, the controller 13 sends a read command and address to the RAM 12 to read the management information stored in the management information area 12A.

Subsequently, the controller 13 transfers the management information read from the management information area 12A to the data register 31 of the NAND flash memory 11 (step S305). That is, the controller 13 sends a register write command, address, data (management information), and executive command to the NAND flash memory 11. In response to this, the NAND flash memory 11 transfers the management information sent thereto from the controller 13 to the data register 31.

Subsequently, the controller 13 brings the RAM 12 into the deep power-down state (step S306). More specifically, the controller 13 issues a command to the RAM 12, the RAM 12 stops its own clock generator, and stops the refresh operation in response to this command. At this time, data stored in the RAM 12 is lost. Alternatively, the controller 13 may turn off the power supply of the RAM 12, i.e., the controller 13 may stop the application of the operating voltage VCCQ to the RAM 12 in place of executing the deep power-down mode.

Figure 9:
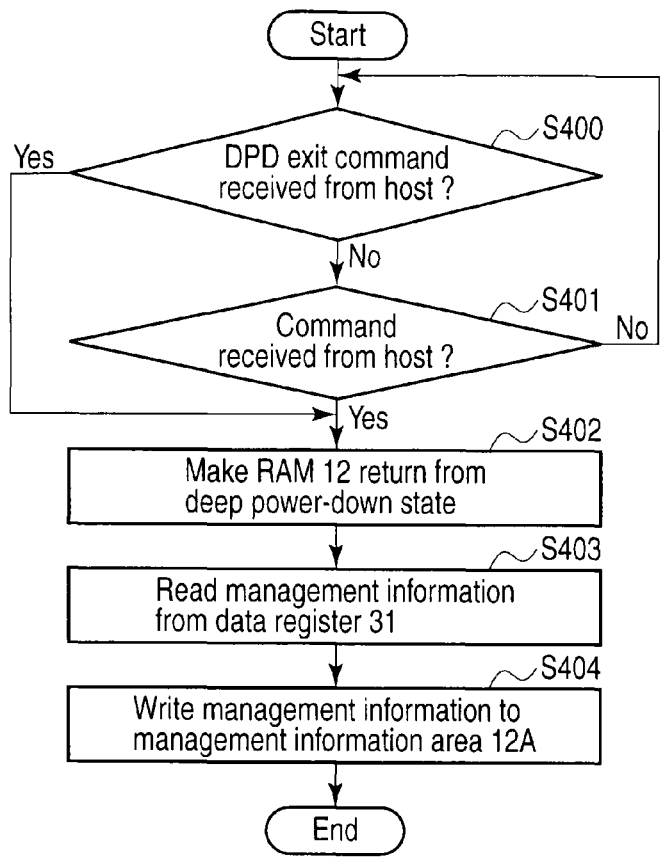
FIG. 9 is a flowchart showing operations of the controller 13 at the time of exiting the deep power-down mode.

FIG. 9 is a flowchart showing operations of the controller 13 at the time of exiting the deep power-down mode. Operations in steps S400 to S401 of FIG. 9 are identical with those in steps S200 to S201 of FIG. 6.

When a deep power-down exit command has been received from the host, or when an arbitrary command has been received from the host, the controller 13 shifts to step S402 to execute deep power-down mode exit processing. First, the controller 13 makes the RAM 12 return from the deep power-down state (step S402). More specifically, the controller 13 issues a command to the RAM 12, the RAM 12 starts its own clock generator, and begins the refresh operation in response to this command. Alternatively, when the power supply of the RAM 12 is off, the controller 13 turns on the power supply of the RAM 12, i.e., the controller 13 starts the application of the operating voltage VCCQ to the RAM 12.

Subsequently, the controller 13 reads the management information from the data register 31 (step S403). More specifically, the controller 13 sends a register read command, address, and executive command to the NAND flash memory 11. In response to this, the NAND flash memory 11 transfers data of the data register 31 to the controller 13.

Subsequently, the controller 13 writes the management information transferred thereto from the data register 31 to the management information area 12A of the RAM 12. That is, the controller 13 sends a write command, address, and data (management information) to the RAM 12 to write the management information read from the NAND flash memory 11 to the management information area 12A.

At this point, in the management information area 12A of the RAM 12, the same data as that before the deep power-down mode is stored. Accordingly, it is possible for the controller 13 to resume and continuously carry out data transfer processing by using data of the RAM 12.

(Advantage)

As described above in detail, according to the second embodiment, it is possible to reduce the power consumption of the RAM 12 in the period in which there is no access from the host and, by extension it is possible to reduce the power consumption of the memory system 10. Further, when the deep power-down mode is exited, there is no need to read the management information from the NAND flash memory 11, and hence it is possible to reduce the data read time.

Further, when the deep power-down mode is exited, management information loaded into the RAM 12 before the deep power-down mode is kept stored therein, and hence the controller 13 can resume and continue the data transfer processing from the state before the deep power-down mode. Hereby, the operation performance of the memory system 10 is improved.

Further, even when the storage capacity of the RAM 12 is greater than the storage capacity of the data register 31, it is possible to select only management information particularly necessary for the processing of the CPU 32, and store the selected management information in the data register 31. Hereby, it is possible to shorten the time required for the recovery from the deep power-down mode.

It should be noted that when the storage capacity of the data register 31 is greater than or equal to the capacity corresponding to a sum of the management information area 12A and write cache area 12C, the controller 13 may transfer data of the management information area 12A and write cache area 12C to the data register 31 of the NAND flash memory 11. In this case, the write-back operation in step S303 of FIG. 8 becomes unnecessary. Hereby, it is possible to shorten the time required to enter the deep power-down mode. In this example, at the time of exiting the deep power-down mode, the controller 13 writes data of the data register 31 to the management information area 12A and write cache area 12C. Further, at the time of recovery from the deep power-down mode, it is possible to use data of the write cache, and hence the operation performance of the controller 13 is improved.

Third Embodiment

Figure 10:
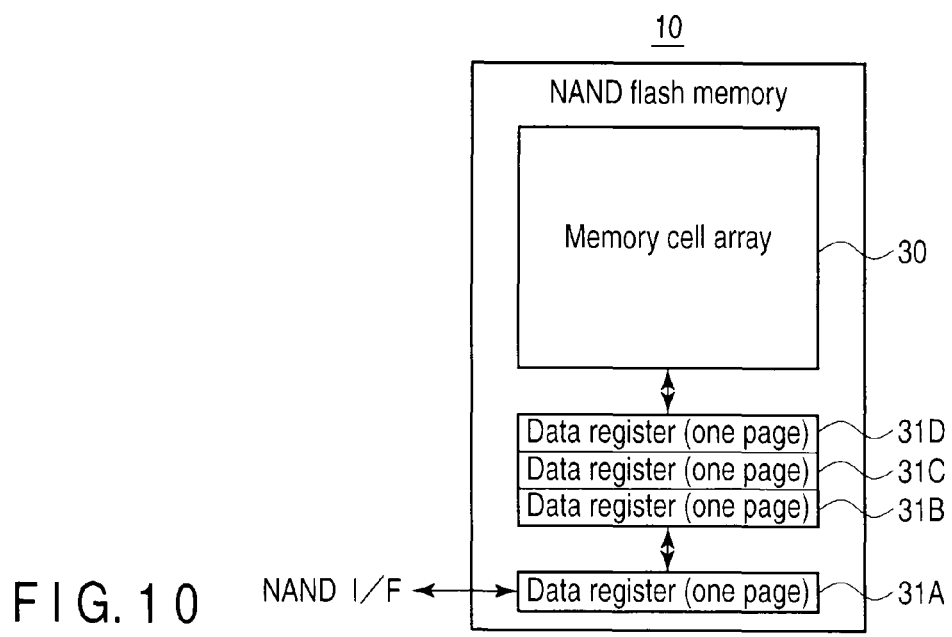
FIG. 10 is a schematic view showing the configuration of a NAND flash memory 11 according to a third embodiment.

A third embodiment is a configuration example in which a NAND flash memory 11 can store multilevel data (data of two or more bits). FIG. 10 is a schematic view showing the configuration of a NAND flash memory 11 according to the third embodiment.

One memory cell transistor MT included in a memory cell array 30 can store therein, for example, three-bit data (octal data). Accordingly, a memory cell group of one raw connected to the same word line WL can store therein data of three pages. The memory cell transistor MT stores data in accordance with a difference in threshold voltage, and hence by fractionalizing the distribution of the threshold voltages, the memory cell transistor MT can store three-bit data.

The NAND flash memory 11 comprises four data registers 31A to 31D each of which can store one page. Data register 31A is used as a data input/output buffer. Three data registers 31B to 31D store three pages to be written to the memory cell array 30.

At the time of data write, the NAND flash memory 11 receives a first page from the controller 13, temporarily stores the first page in data register 31A, and thereafter transfers the first page to data register 31B. Subsequently, the NAND flash memory 11 receives a second page from the controller 13, temporarily stores the second page in data register 31A, and thereafter transfers the second page to data register 31C. Subsequently, the NAND flash memory 11 receives a third page from the controller 13, temporarily stores the third page in data register 31A, and thereafter transfers the third page to data register 31D. Further, the NAND flash memory 11 writes the three pages stored in the three data registers 31B to 31D to the memory cell array 30.

At the time of data read, the NAND flash memory 11 reads the first to third pages from the memory cell array 30, and stores the first to third pages in data registers 31B to 31D, respectively. Further, the NAND flash memory 11 can read only one page from the memory cell array 30, and can also read only two pages therefrom.

The NAND flash memory 11 configured in this way can store four pages in data registers 31A to 31D at a time.

Accordingly, at the time of the deep power-down mode, the controller 13 transfers data of four pages among data items stored in the RAM 12 to the NAND flash memory 11. An operation of entering the deep power-down mode, and operation of exiting from the deep power-down mode are identical with the first embodiment, and second embodiment except for that the data size is different.

As described above in detail, according to the third embodiment, at the time of the deep power-down mode, it is possible to increase the storage capacity of the data register that is the destination to which data of the RAM 12 is transferred. Hereby, at the time of the deep power-down mode, it becomes possible to transfer more data items among data items stored in the RAM 12 to the NAND flash memory 11.

Fourth Embodiment

A fourth embodiment is a configuration example of a server system configured to maintain data of a high degree of importance for a long time. In recent years, a solid-state drive (SSD) employing a NAND flash memory as a storage is utilized in a server system as an alternative to a hard disk drive (HDD). For example, in a server system provided with a RAM and NAND flash memory, in order to prevent data loss due to instantaneous power discontinuity (instantaneous interruption), a supercapacitor is provided as emergency power supply means.

Figure 11:
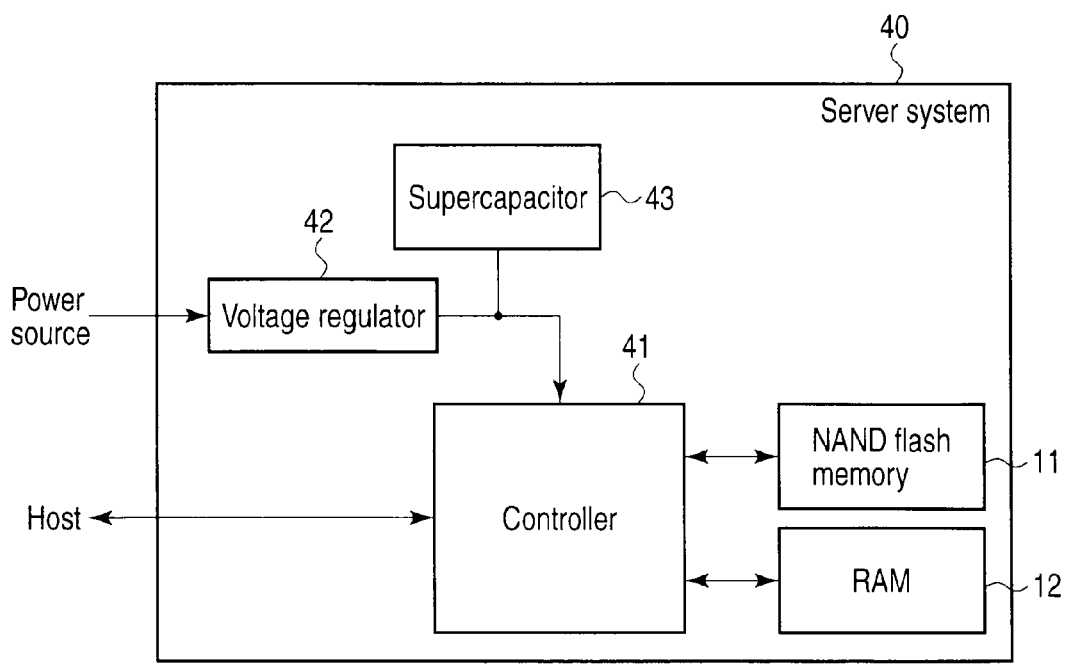
FIG. 11 is block diagram showing the configuration of a server system 40 according to a fourth embodiment.

FIG. 11 is block diagram showing the configuration of a server system 40 according to the fourth embodiment. The server system 40 comprises a controller 41, voltage regulator 42, RAM 12, NAND flash memory 11, and supercapacitor 43. The controller 41 carries out data transfer between itself and a host in accordance with an instruction from the host. In order to execute the data transfer, the controller 41 controls the RAM 12 and NAND flash memory 11.

The voltage regulator 42 controls the external power, and applies a constant voltage to the controller 41. The NAND flash memory 11 stores and retains therein a mass of data as a main storage area of the server system 40. The RAM 12 bears a role of, for example, a working area of the controller 41, read cache configured to increase a speed of read from the NAND flash memory 11 or write cache configured to increase a speed of write to the NAND flash memory 11.

The supercapacitor 43 is connected at a midway of a wiring connecting the voltage regulator 42 and controller 41. When the controller 41 detects abnormal lowering, instantaneous interruption or the like of an output voltage of the voltage regulator 42, a voltage is applied from the supercapacitor 43 to the controller 41. Even when the external power supply is stopped, the RAM 12 and NAND flash memory 11 can operate for a predetermined period on the basis of the voltage applied by the supercapacitor 43 to the controller 41.

(Operation)

Next, operations of the server system 40 configured in this way will be described below. FIG. 12 is a flowchart showing operations of the controller 41 to be carried out when the external power supply is stopped.

The controller 41 monitors the power supply voltage applied thereto from the external power source through the voltage regulator (step S500). When abnormal power discontinuity has been detected, the controller 41 shifts to step S501 to execute processing of data saving from the RAM 12. When no abnormal power discontinuity is detected, the controller 41 executes processing in accordance with a command from the host.

Upon detecting abnormal power discontinuity, the controller 41 receives an emergency power supply from the supercapacitor 43 (step S501). The controller 41 provides the power supply from the supercapacitor 43 to the RAM 12 and NAND flash memory 11. Thereby, it is possible to prevent the data stored in the RAM 12 from being lost.

Subsequently, the controller 41 transfers the data stored in the RAM 12 to the data register 31 of the NAND flash memory 11 (step S502). After all the data items stored in the RAM 12 are transferred to the data register 31, the controller 41 shifts to step S503.

In step S503, the controller 41 stops the power supply from the supercapacitor 43 to the RAM 12. The data items stored in the RAM 12 have already been saved in the data register 31, and hence important data is never lost.

Subsequently, in the period in which the power supply from the supercapacitor 43 is continued, the controller 41 monitors recovery of the external power source (step S504). When the recovery of the external power source is detected, the controller 41 shifts to step S505.

In step S505, the controller 41 resumes the power supply from the external power source to the RAM 12 through the voltage regulator 42 (step S505). Subsequently, the controller 41 transfers data stored in the data register 31 of the NAND flash memory 11 to the RAM 12 (step S506).

(Advantage)

Although the consumption current of a DRAM is, for example, of the order of mA, the consumption current of a NAND flash memory is, for example, about 50 $\mu$A, the difference between them being very large. Accordingly, when a supercapacitor having a fixed capacitance is used, and when power is supplied only to a NAND flash memory, it is possible to retain a standby state for a long time.

Further, in the fourth embodiment, data of the RAM 12 is not written to the memory cell array 30 but to the data register 31, and hence the consumption current of the NAND flash memory 11 is small. Furthermore, data transfer to the data register 31 is carried out at relatively high speed. Hereby, the need to incorporate a supercapacitor having a large capacitance into the server system 40 as a countermeasure against instantaneous power discontinuity is eliminated. That is, when the period of the power discontinuity is short, even by using a supercapacitor having a small capacitance, it is possible to retain data of the RAM 12 on the data register 31 of the NAND flash memory 11. Hereby, it is possible to reduce the circuit area, and cost of the server system 40.

It should be noted that the second embodiment in which only specific data is selected from among the data items stored in the RAM 12, and is stored in the data register 31, and third embodiment in which the NAND flash memory 11 can store multilevel data can also be applied to the fourth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a NAND flash memory comprising a memory cell array comprising pages, and a volatile data register with a storage capacity of one page, and configured to write page data to the memory cell array through the data register, each of the pages comprising nonvolatile memory cells and being a unit of data write;
a volatile RAM; and
a controller comprising a power saving mode in which power consumption of the RAM is reduced, and configured to transfer data of the RAM to the data register before entering the power saving mode.

2. The system of claim 1, wherein
the controller transfers data of the data register to the RAM when the controller exits from the power saving mode.

3. The system of claim 1, wherein
the RAM includes a storage area in which management information used to manage a state of the NAND flash memory is stored, and
the controller transfers the management information stored in the RAM to the data register before entering the power saving mode.

4. The system of claim 3, wherein
a storage capacity of the RAM is greater than the storage capacity of the data register.

5. The system of claim 1, further comprising a power supply circuit configured to generate a first voltage assuring an operation of the NAND flash memory, and a second voltage assuring an operation of the RAM, wherein
the first voltage is applied to the NAND flash memory, and the second voltage is applied to the RAM through the controller.

6. The system of claim 1, wherein
the power saving mode is a deep power-down mode.

7. The system of claim 1, wherein
the controller turns off the power supply to the RAM during the power saving mode.

8. A memory system comprising:
a NAND flash memory comprising a memory cell array comprising pages, and a volatile data register with a storage capacity of at least y pages (y is an integer greater than 1), and configured to write page data to the memory cell array through the data register, each of the pages comprising nonvolatile memory cells and being a unit of data write, the nonvolatile memory cell being storable of y bits;
a volatile RAM; and
a controller comprising a power saving mode in which power consumption of the RAM is reduced, and configured to transfer data of the RAM to the data register before entering the power saving mode.

9. The system of claim 8, wherein
the data register includes a first register having a storage capacity of y pages, and a second register having a storage capacity of one page and functioning as a buffer.

10. The system of claim 8, wherein
the controller transfers data of the data register to the RAM when the controller exits from the power saving mode.

11. The system of claim 8, wherein
the RAM includes a storage area in which management information used to manage a state of the NAND flash memory is stored, and
the controller transfers the management information stored in the RAM to the data register before entering the power saving mode.

12. The system of claim 11, wherein
a storage capacity of the RAM is greater than the storage capacity of the data register.

13. The system of claim 8, further comprising a power supply circuit configured to generate a first voltage assuring an operation of the NAND flash memory, and a second voltage assuring an operation of the RAM, wherein
the first voltage is applied to the NAND flash memory, and the second voltage is applied to the RAM through the controller.

14. The system of claim 8, wherein
the power saving mode is a deep power-down mode.

15. The system of claim 8, wherein
the controller turns off the power supply to the RAM during the power saving mode.

16. A server system comprising:
a NAND flash memory comprising a memory cell array comprising pages, and a volatile data register with a storage capacity of one page, and configured to write page data to the memory cell array through the data register, each of the pages comprising nonvolatile memory cells and being a unit of data write;
a volatile RAM;
a controller configured to transfer data of the RAM to the data register when power supply abnormally is turned off; and
a capacitor configured to apply a voltage to the controller when the power supply abnormally is turned off.

17. The system of claim 16, wherein
the controller stops voltage application to the RAM after the data of the RAM is transferred to the data register.

18. The system of claim 16, wherein
the controller transfers data of the data register to the RAM when the power supply recovers.

19. The system of claim 16, further comprising a voltage regulator configured to receive external power supply, and apply a voltage to the controller and the capacitor.

20. The system of claim 16, wherein
the RAM includes a storage area in which management information used to manage a state of the NAND flash memory is stored, and
the controller transfers the management information stored in the RAM to the data register when the power supply abnormally is turned off.

* * * * *